(12) United States Patent
Sasaki

(10) Patent No.: US 6,810,451 B2
(45) Date of Patent: Oct. 26, 2004

(54) CARD-SHAPED ELECTRONIC APPARATUS

(75) Inventor: Yasutaka Sasaki, Tachikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 173 days.

(21) Appl. No.: 10/228,185

(22) Filed: Aug. 27, 2002

(65) Prior Publication Data

US 2003/0065837 A1 Apr. 3, 2003

(30) Foreign Application Priority Data

Sep. 28, 2001 (JP) ........................................ 2001-303881

(51) Int. Cl.$^7$ ........................... G06F 1/16; G06F 13/12; H01L 25/07
(52) U.S. Cl. ................. 710/74; 710/2; 710/8; 710/13; 710/72; 710/300; 710/301; 710/303
(58) Field of Search ........................... 710/2, 8, 13, 72, 710/74, 300, 301, 303

(56) References Cited

U.S. PATENT DOCUMENTS

| | | | |
|---|---|---|---|
| 5,654,875 A | | 8/1997 | Lawson |
| 5,732,064 A | | 3/1998 | Huang |
| 5,740,377 A | * | 4/1998 | Sonobe ........................ 710/301 |
| 5,883,870 A | | 3/1999 | Akiba et al. |
| 6,212,580 B1 | * | 4/2001 | Ihara et al. ..................... 710/8 |
| 6,249,432 B1 | | 6/2001 | Gamble et al. |
| 6,346,793 B1 | * | 2/2002 | Shibata et al. ............... 320/113 |
| 6,604,152 B1 | * | 8/2003 | Bard et al. ..................... 710/16 |

FOREIGN PATENT DOCUMENTS

| | | | |
|---|---|---|---|
| EP | 0716450 A1 * | 6/1996 | .......... H01L/25/07 |
| GB | 2342759 | 4/2000 | |
| JP | 3-27076 | 3/1991 | |
| JP | 3-27078 | 3/1991 | |
| JP | 406323815 A * | 11/1994 | .......... G01B/11/00 |
| JP | 9-16287 | 1/1997 | |
| JP | 2923476 | 4/1999 | |
| JP | 2000-30428 | 1/2000 | |
| JP | 2001-126463 | 5/2001 | |

OTHER PUBLICATIONS

A copy of the Office Action for Singapore Application No. 200204975–7, citing the references (dated Mar. 12, 2004).

* cited by examiner

*Primary Examiner*—Rehana Perveen
(74) *Attorney, Agent, or Firm*—Pillsbury Winthrop LLP

(57) ABSTRACT

A card-shaped electronic apparatus includes a base in the form of a substantially rectangular plate having a natural bending vibration mode, components mounted on the base, and covers attached to the base and covering the components. The base has a pair of side edge portions capable of being guided along a pair of guide rails of a card slot. Protrusions for determining the position where the base contacts the guide rails are located individually near positions corresponding to nodes of the bending vibration mode on each side edge portion, and project in the thickness direction of the base.

10 Claims, 7 Drawing Sheets

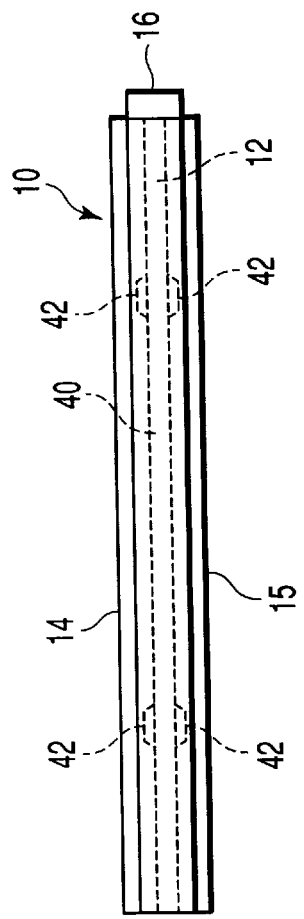
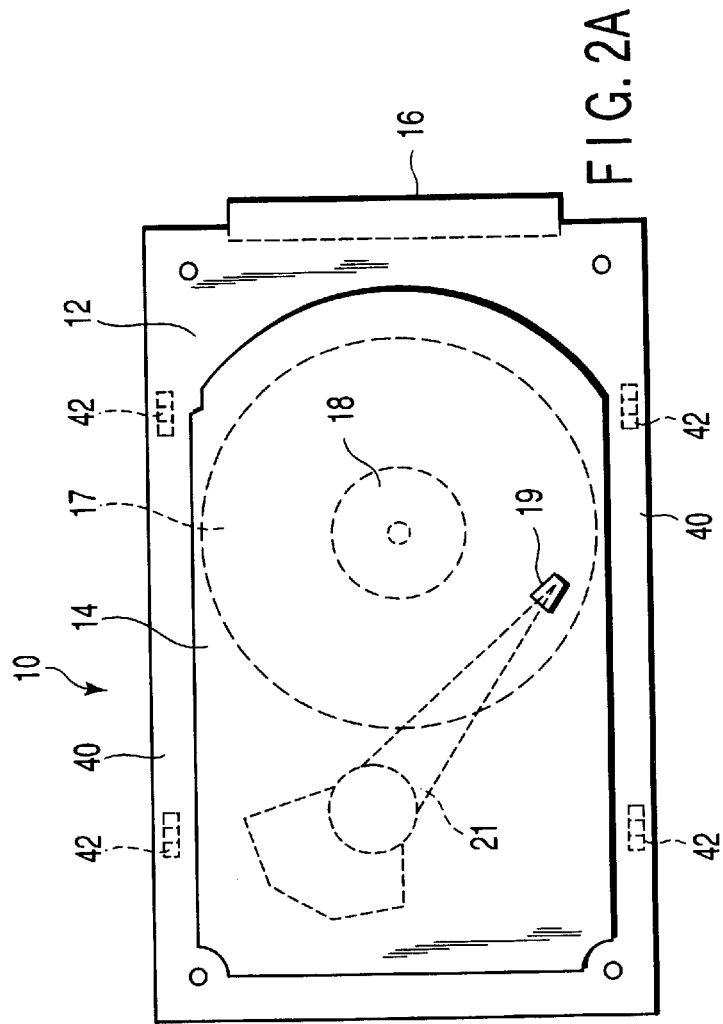
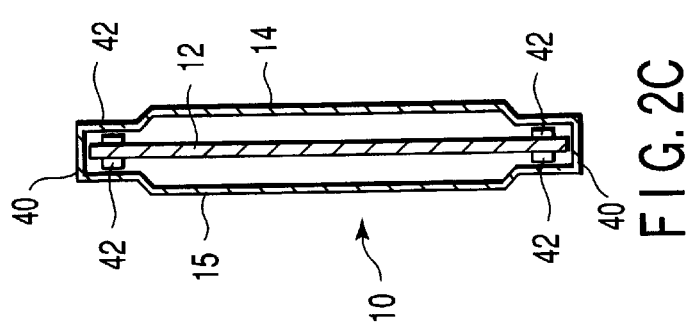
FIG. 2A
FIG. 2B
FIG. 2C

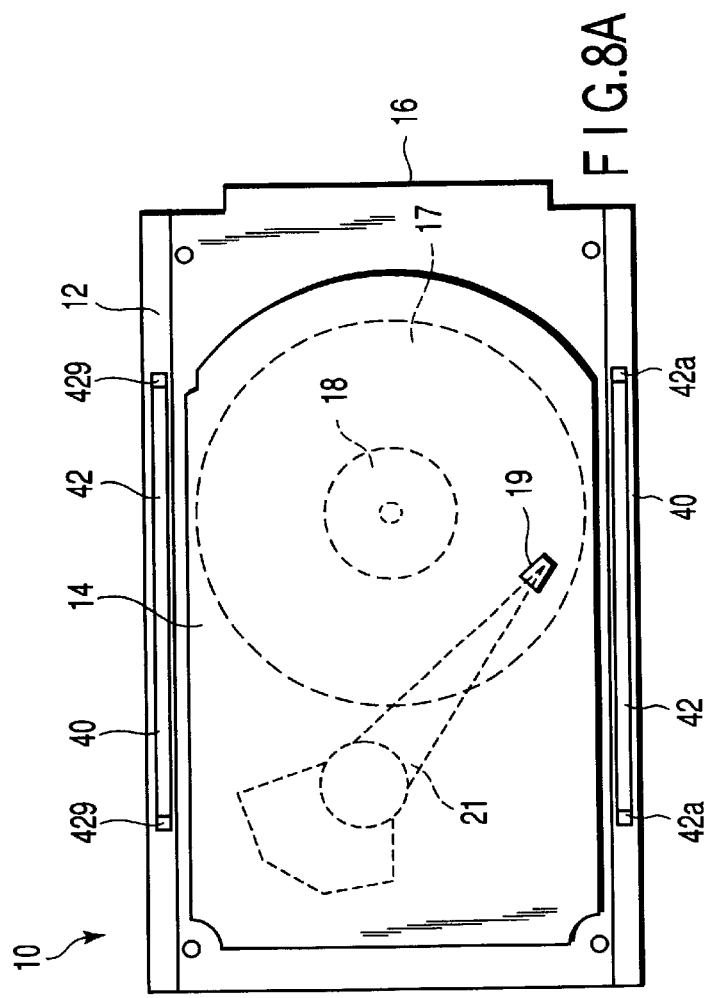
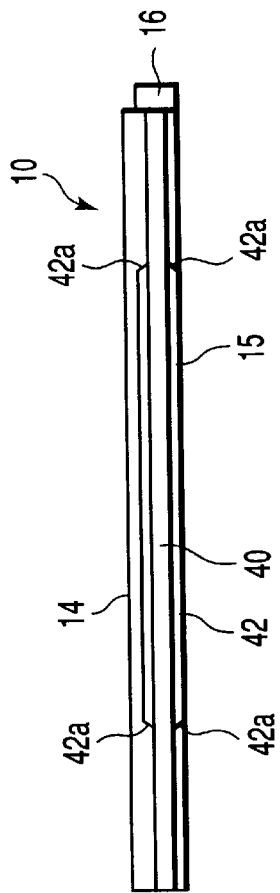
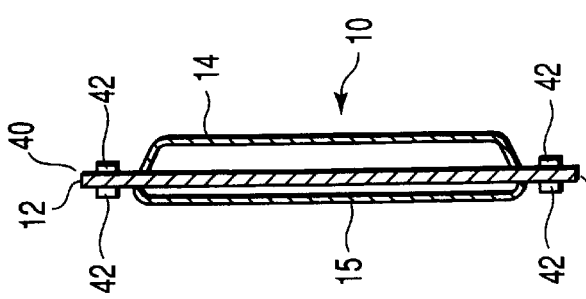
FIG. 8A
FIG. 8B
FIG. 8C

CARD-SHAPED ELECTRONIC APPARATUS

CROSS-REFERENCE TO RELATED APPLICATIONS

This application is based upon and claims the benefit of priority from the prior Japanese Patent Application No. 2001-303881, filed Sep. 28, 2001, the entire contents of which are incorporated herein by reference.

BACKGROUND OF THE INVENTION

1. Field of the Invention

The present invention relates to a card-shaped electronic apparatus capable of being inserted into a card slot.

2. Description of the Related Art

Recording/reproducing devices, such as magnetic disk drives, optical disk drives, flash memories, and the like are widely used as external storage devices for computers nowadays. Recently, moreover, computers which have PCMCIA-card slots have spread, especially in notebook-type personal computers. Correspondingly, external storage devices that can be inserted into the card slots of the computers have been developed as removable storage media.

On the other hand, miniaturization of hard disk drives (hereinafter referred to as HDDs) has advanced increasingly. Recently, 1- and 1.8-inch HDDs that are expected to be used as removable HDDs have been developed. They are card-shaped HDDs that can be inserted into PCMCIA-card slots.

The card-shaped external storage devices and electronic apparatuses that can be used in the card slots are generally subjected to shock event, so high shock and vibration resistance are required. In general, however, these apparatuses are not so strong against, and sometimes they are carried in a case that is covered with a shock-absorbing member.

These card-shaped electronic apparatuses are fixed in a card slot during operation, so that external shock to the card slot may cause serious damage such as a loss of information. Accordingly, improvement in the resistance against shock and vibration during operation is very important.

When a card-shaped electronic apparatus is set in a card slot, it is supported only by a connector portion, and there is no other solid supporting portions. Its side edge portions are supported in a substantially free state with a small gap with respect to rails of the card slot. If any heavy shock or vibration applies on the card slot, therefore, there is a high possibility that the front or rear edge of the electronic apparatus collides against the card slot rails.

If this collision occurs, the thin card-shaped structure vibrates with a conventional bending vibration mode. Since card-shaped electronic apparatuses that can be inserted into a card slot, including HDDs, have substantially the same exterior design, they have substantially the same bending mode shape although the mode frequency is various.

Since this bending mode frequency is in a low frequency range such as hundreds of hertz, it is the most critical vibration mode that generates large amplitude if any vibration or shock applies on the electronic apparatus. In order to improve the shock and vibration resistance of the card-shaped electronic apparatus, therefore, it is better to increase the natural frequency of the vibration mode.

In general, however, a card-shaped electronic apparatus is limited in thickness in order to meet the standard requirements of the card slot, so it is difficult to increase the natural frequency enough.

BRIEF SUMMARY OF THE INVENTION

The present invention has been contrived in consideration of these circumstances, and its object is to provide a card-shaped electronic apparatus with improved shock and vibration resistance.

In order to achieve the above object, a card-shaped electronic apparatus according to an aspect of the invention is an electronic apparatus that can be inserted into a card slot having a pair of guide rails opposed substantially parallel to each other. This apparatus comprises: a base in the form of a substantially rectangular plate on which components are mounted and having a natural bending vibration mode; and a cover attached to the base and spreading over the components, the base having a pair of side edge portions configured to be guided along the guide rails, and a plurality of protrusions configured to determine the positions where the base contacts the guide rails through or not through the cover, the protrusions being located individually near positions corresponding to nodes of the bending vibration mode on each side edge portion and projecting in the thickness direction of the base.

A card-shaped electronic apparatus according to another aspect of the invention is an electronic apparatus that can be inserted into a card slot having a pair of guide rails opposed substantially in parallel relation to each other. This apparatus comprises: a base in the form of a substantially rectangular plate on which components are mounted and having side edge portions and a natural bending vibration mode; and a cover spreading over the base, the cover having a pair of side edge portions in contact with the side edge portions of the base, individually, and capable of being guided along the guide rails, and a plurality of protrusions configured to determine the positions where the base contacts the guide rails through the cover, the protrusions being located individually near positions corresponding to nodes of the bending vibration mode on each side edge portion of the cover and projecting in the thickness direction of the base.

A card-shaped electronic apparatus according to still another aspect of the invention is an electronic apparatus that can be is loaded into a card storage portion. This apparatus comprises a base in the form of a substantially rectangular plate on which components are mounted and having a natural bending vibration mode; and a cover attached to the base and spreading over the components, the base having a side edge portion capable of engaging the card storage portion and a protrusion configured to determine the position where the base contacts the guide rails, the protrusion being located near a position corresponding to a node of the bending vibration mode on the side edge portion and projecting in the thickness direction of the base.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 2A, 2B and 2C are a plan view, a side view, and a sectional view, respectively, of the HDD;

FIGS. 8A, 8B and 8C are a plan view, a side view, and a sectional view, respectively, showing an HDD according to a fourth embodiment of the invention.

DETAILED DESCRIPTION OF THE INVENTION

An embodiment of the present invention applied to an HDD will now be described in detail with reference to the accompanying drawings.

Figure 1:
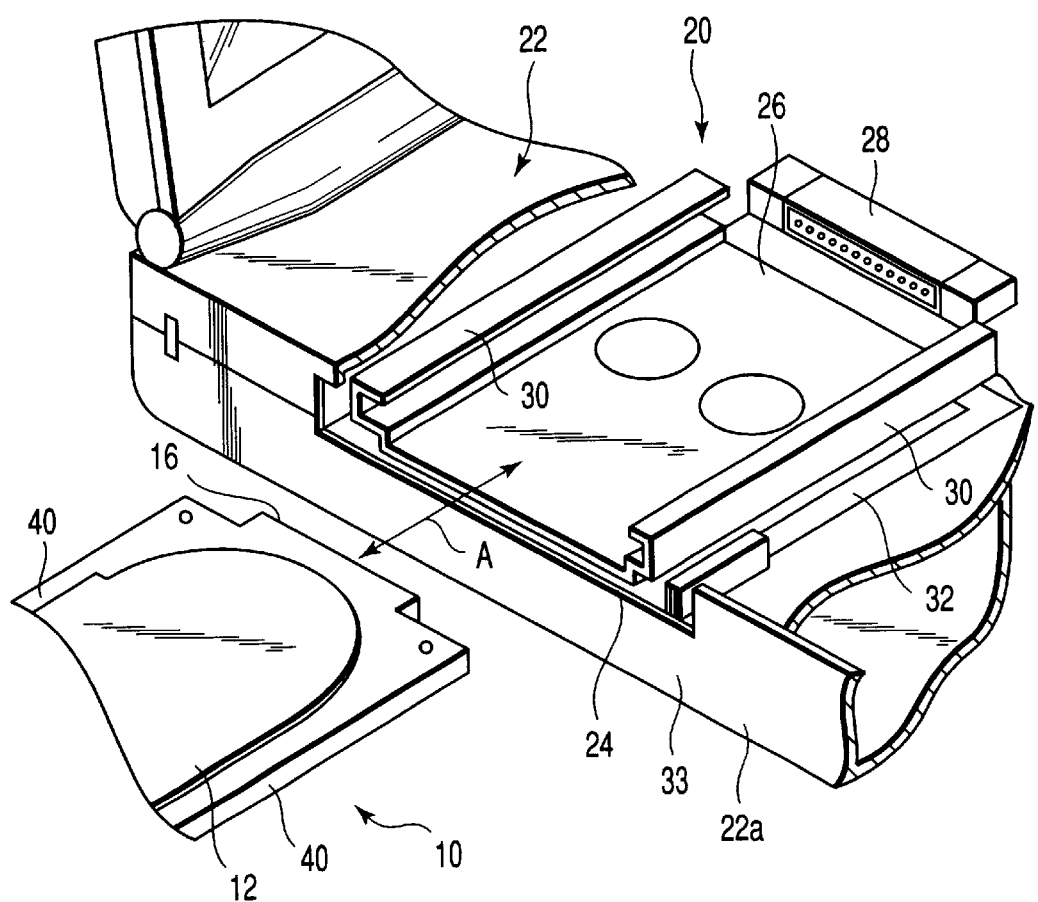
FIG. 1 is an exploded perspective view showing an HDD according to a first embodiment of the invention and a card slot of a personal computer.

As shown in FIG. 1, an HDD 10 is in the form of a card that complies with the PCMCIA type-II standard, for example. The HDD 10 is designed so that it can be inserted into and taken out of a PCMCIA-card slot 20 that is formed in a personal computer, for example.

The card slot 20 that serves as a card storage portion will be described first. The card slot 20 is located in an apparatus body 22 of the personal computer and has an inlet 24 that is formed in a sidewall 22a of the apparatus body. The inlet 24 has an elongate rectangular shape corresponding to the profile of the HDD 10 that serves as a card-shaped electronic apparatus.

The card slot 20 is provided with a cardholder 26 in the shape of a rectangular tray and a connector 28, which are located continuously with the inlet 24 in the apparatus body 22. The cardholder 26 is formed by bending a metal plate, and its opposite side edge portions constitute guide rails 30, individually. The guide rails 30, having a U-shaped cross section each, are opposed substantially in parallel to each other, and extend in a loading direction A of the HDD 10 from the inlet 24. The paired guide rails 30 function as guide means for the HDD 10 to be inserted into or taken out of the card slot 20 and serve to engage and hold the set HDD.

Further, the card slot 20 has therein an eject lever 32, which extends in the loading direction A beside the cardholder 26. The rear end portion of the eject lever 32 engages the connector 28. An eject button 33 is attached to the distal end of the lever 32 and is situated side by side with the inlet 24.

As shown in FIGS. 2A to 2C, the HDD 10 comprises a base 12 in the form of a rectangular metal plate, and various components (mentioned later) are mounted on the top side of the base. Further, the HDD 10 comprises a plate-shaped top cover 14 that spreads over the upper surface of the base 12, a printed circuit board (not shown) on the bottom side of the base, and a bottom cover 15 that conceals the printed circuit board and the bottom side of the base. All these elements are stacked in layers to form a card as a whole. A connector 16 is attached to the printed circuit board and located on the front end of the HDD 10 with respect to its loading direction.

The base 12 carries thereon a 1.8-inch magnetic disk 17 that serves as an information recording medium, a spindle motor 18 as a drive motor for supporting and rotating the magnetic disk, and a plurality of magnetic heads 19 for writing information to and reading it from the magnetic disk. The base 12 further carries thereon a head actuator 21 that supports and moves the magnetic heads with respect to the magnetic disk 17, a ramp loading mechanism (not shown), an inertia latch mechanism, etc.

The respective opposite side edge portions of the top and bottom covers 14 and 15 that cover a pair of long side edge portions of the base 12 have a width and height such that they can be guided individually along the guide rails 30 of the card slot 20, and constitute guide portions 40, individually. As the HDD 10 is inserted into or taken out of the card slot 20, the guide portions 40 engage their corresponding guide rails 30 of the cardholder 26, thereby guiding the HDD in movement and holding it in the cardholder.

Figure 3:
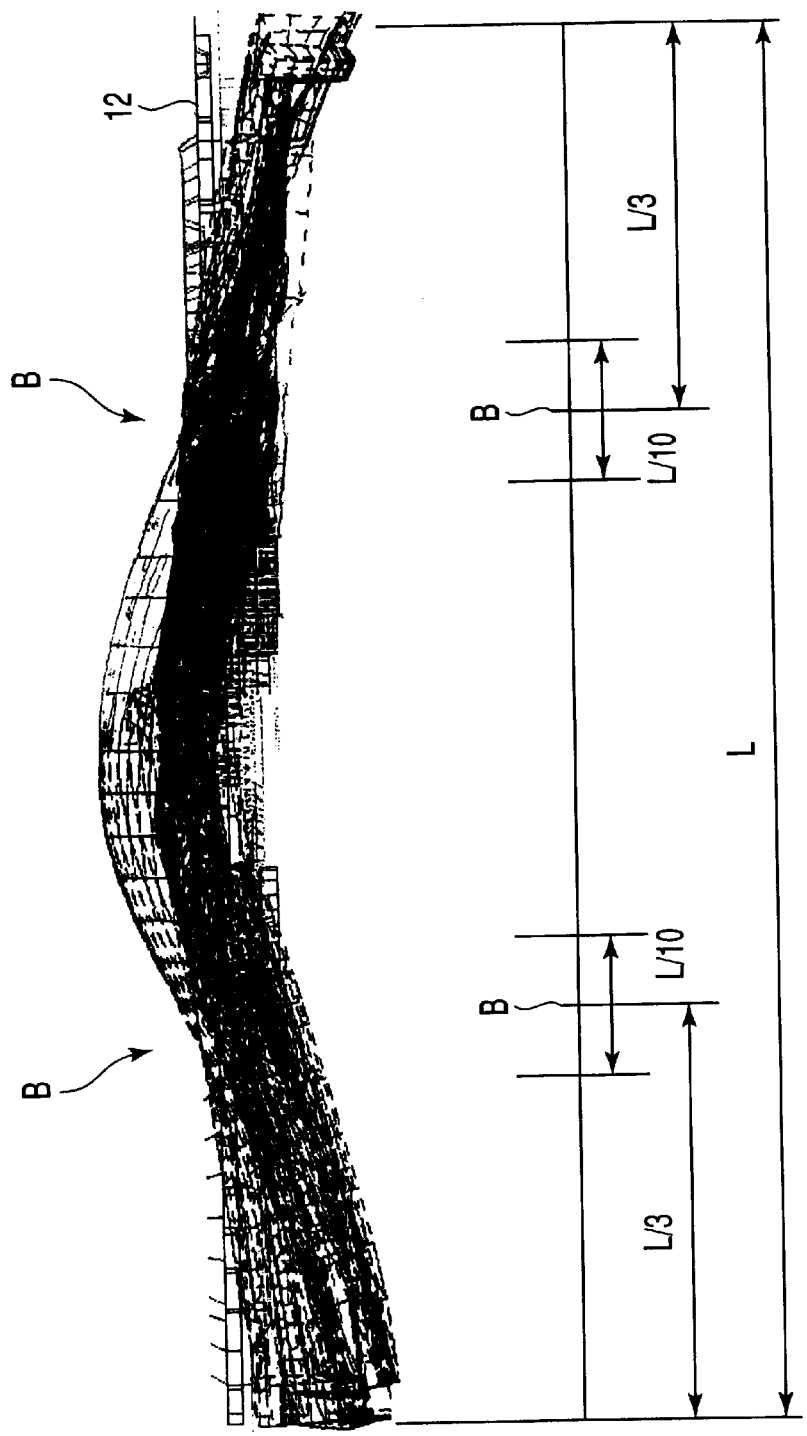
FIG. 3 is a diagram typically showing the simulated result of a vibration mode of the HDD.

The base 12 has a plurality of protrusions 42 on each long side edge portion. The protrusions 42 are located individually in positions corresponding to the nodes of the bending vibration mode of the base 12, and project in the thickness direction of the base. FIG. 3 shows the result of a simulation of the state of the base 12 vibrating in the bending vibration mode. Since the connector structure 16 is much weaker than the base 12, it hardly influences the vibration mode form. As seen from FIG. 3, the bending vibration mode of the base 12 has two nodes B that are spaced in the longitudinal direction of the base. If the length of the base 12 is L, each node B is generated at a position a distance of about L/3 from its corresponding end of the base in the longitudinal direction.

Two pairs of protrusions 42 are located individually near positions corresponding to the nodes B on each side edge portion of the base 12, and project on the top and bottom sides of the base. Thus, the protrusions 42 formed on the opposite side edge portions of the base 12 are eight in total, including four that project on the top side and another four that project on the bottom side.

The height of projection of each protrusion 42 is adjusted to 0.5 to 2.0 mm, for example. It is necessary only that each protrusion 42 be located within the range of about ±L/20 from the position corresponding to each node B in the longitudinal direction of the base 12.

Figure 4:
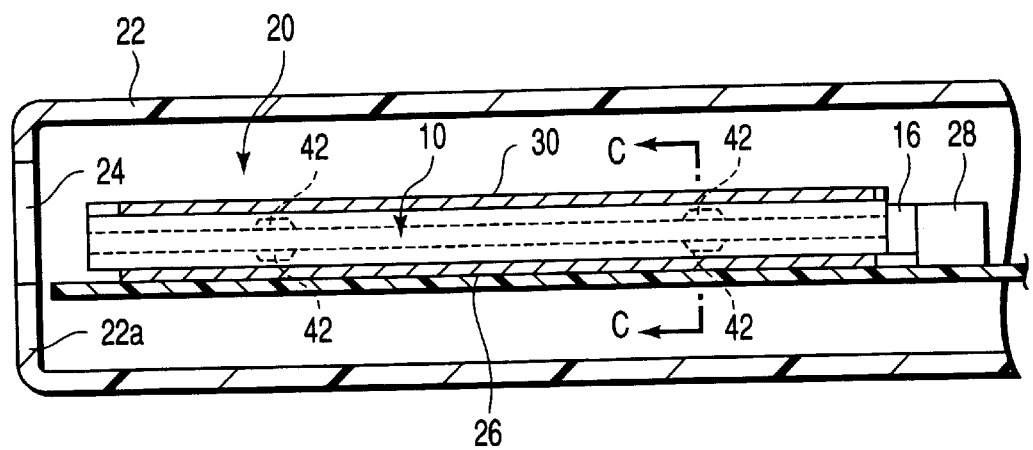
FIG. 4 is a sectional view showing the HDD set in a cardholder of the card slot.
Figure 5:
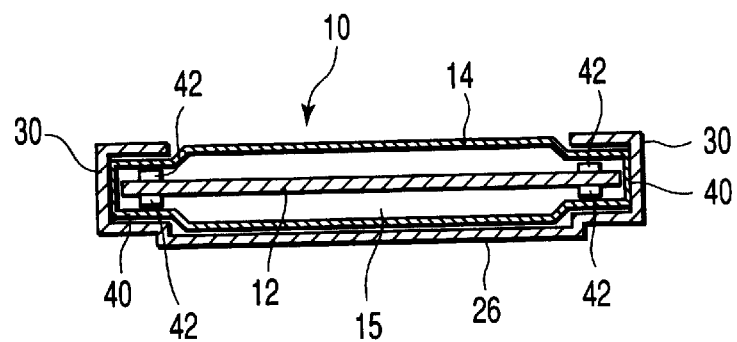
FIG. 5 is a sectional view taken along line C—C of FIG. 4.

If the HDD 10 with this configuration is inserted into the card slot 20 in the loading direction A through the inlet 24, as shown in FIGS. 1, 4 and 5, the two guide portions 40 of the HDD individually engage the guide rails 30 of the cardholder 26 and are guided into the card slot by the guide rails. If the HDD 10 is inserted deeper into the card slot 20, the connector 16 on the distal end of the HDD mates with the connector 28 of the card slot 20. At the same time, the HDD 10 is restricted in movement in its width and thickness directions by the guide rails 30 of the cardholder 26. Thus, the HDD 10 is set in a predetermined position in the card slot 20 and connected electrically to a personal computer.

In unloading the HDD 10 from the card slot 20, the eject button 33 is depressed, whereupon the HDD and the connector 28 are disconnected, and the HDD is pushed out through the inlet 24. In this state, the HDD 10 can be taken out of the inlet 24.

According to the HDD 10 constructed in this manner, the protrusions 42 are provided on each side edge portions of the base 12. If any vibration or shock applies on the card slot 20 that is loaded with the HDD 10, therefore, the base 12 comes into contact with the cardholder 26 of the card slot through the protrusions 42. Thus, the position of contact of the base 12 with the cardholder 26 is determined by the protrusions 42. The vibration or shock generated in the card slot 20 is transmitted to the base 12 through the protrusions 42.

However, the protrusions 42 are located near the positions corresponding to the nodes B of the bending vibration mode of the base 12. If any external force applies on the base 12 through the protrusions, therefore, the base bending vibration mode shown in FIG. 3 is never excited. Accordingly, the magnetic disk 17, magnetic heads 19, etc., on the base 12 can be restrained from undergoing vibration that is unfavorable for reading and writing of information. Thus, the HDD can be protected against erroneous operation and damage, so that its reliability can be improved.

According to the present embodiment, as described above, the card-shaped HDD with improved shock and vibration resistance can be obtained not by increasing the natural frequency of the bending vibration mode, but by preventing the excitation of the bending vibration mode itself.

Figure 6A:
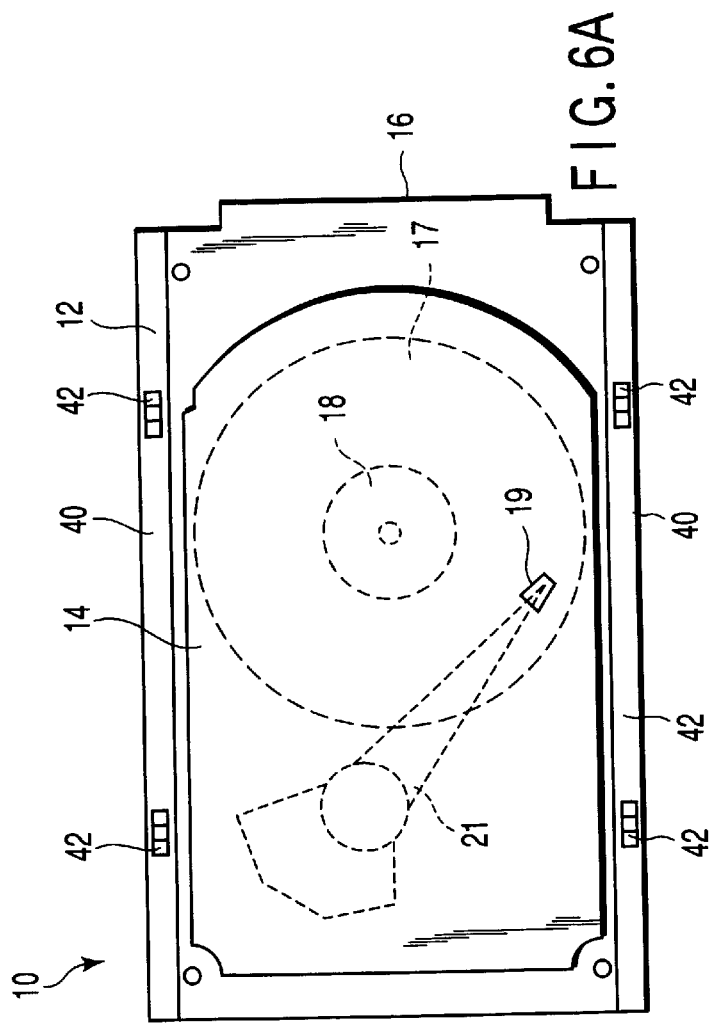
FIGS. 6A, 6B and 6C are a plan view, a side view, and a sectional view, respectively, showing an HDD according to a second embodiment of the invention.
Figure 6B:
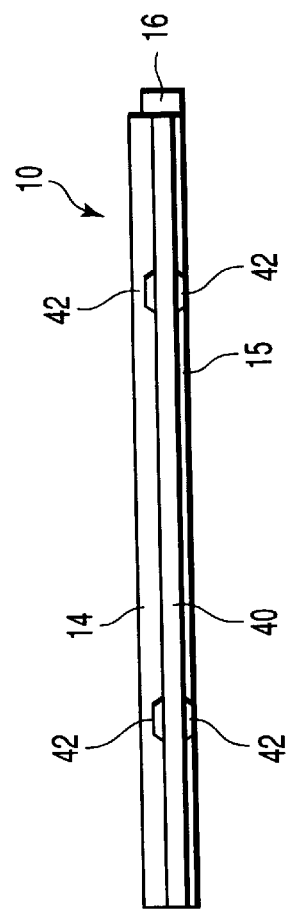
Figure 6C:
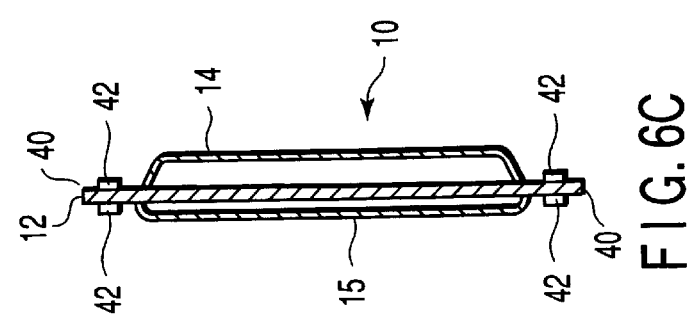

The following is a description of an HDD according to a second embodiment of the invention. In the first embodiment, the top and bottom covers 14 and 15 conceal the entire base 12 including its opposite side edge portions. According to the second embodiment, however, the opposite side edge portions of the base 12 are exposed without being covered by the top and bottom covers 14 and 15, as shown in FIGS. 6A, 6B and 6C. Thus, the side edge portions of the base 12 constitute the guide portions 40, and the protrusions 42 are also exposed.

Figure 7A:
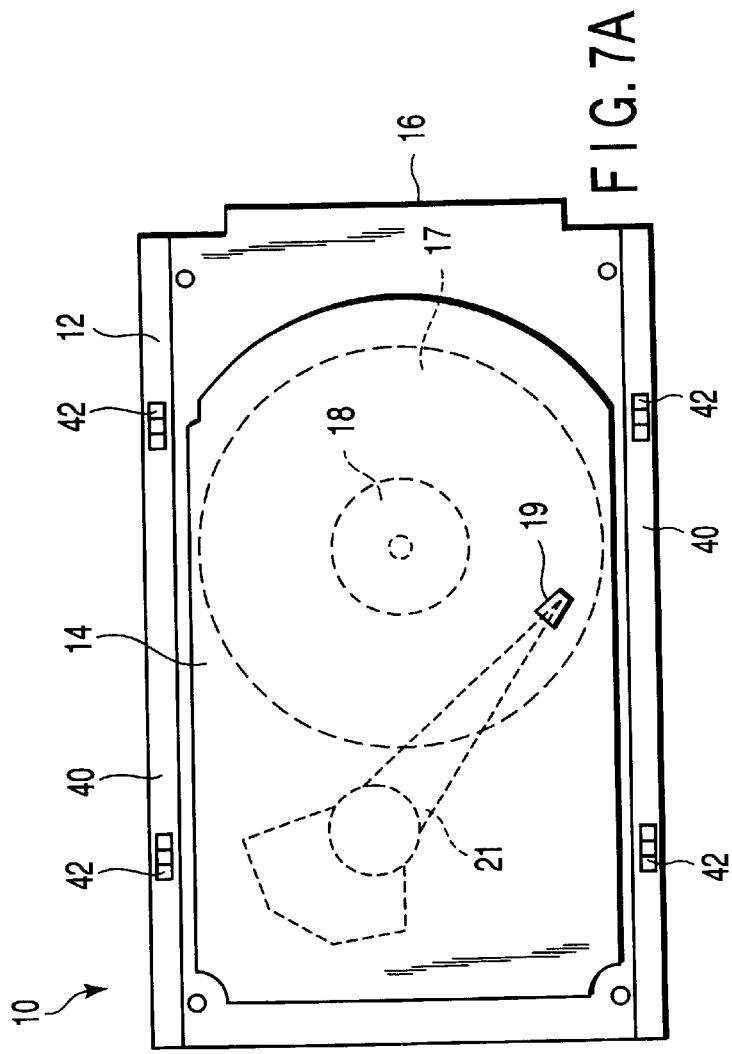
FIGS. 7A, 7B and 7C are a plan view, a side view, and a sectional view, respectively, showing an HDD according to a third embodiment of the invention.
Figure 7B:
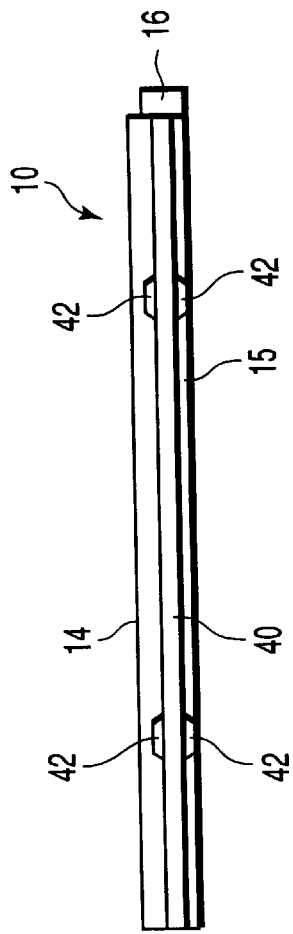
Figure 7C:
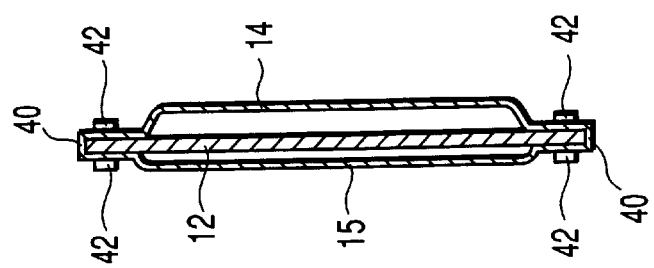

In the first and second embodiments, moreover, the protrusions 42 are provided on the side edge portions of the base 12. As in a third embodiment shown in FIGS. 7A, 7B and 7C, however, the protrusions 42 may be provided individually on the respective side edge portions of the top and bottom covers 14 and 15 that cover the opposite side edge portions of the base 12 in a manner such that the respective side edge portions of the covers are substantially intimately in contact with the side edge portions of the base.

The second and third embodiments share other configurations with the first embodiment. Therefore, like reference numerals are used to designate like portions of these embodiments, and a detailed description of those portions is omitted. HDDs according to the second and third embodiments can work with the same effects as the HDD according to the first embodiment.

In the first to third embodiments, the independent protrusions 42 are located individually near the positions corresponding to the nodes of the bending vibration mode of the base 12. As in a fourth embodiment shown in FIGS. 8A, 8B and 8C, however, the protrusions 42 may be elongated ridges that extend individually along the side edges of the base 12 between the positions corresponding to the two nodes B, on the top and bottom sides of each side edge portion of the base. More specifically, in this case, the protrusions 42, four in total, are formed individually on the top and bottom sides of the opposite side edge portions of the base 12. Each protrusion 42 has longitudinally opposite end portions 42a that are situated individually near the positions corresponding to the nodes B of the bending vibration mode. The fourth embodiment shares other configurations with the first embodiment. Therefore, like reference numerals are used to designate like portions of these embodiments, and a detailed description of those portions is omitted.

According to the HDD 10 constructed in this manner, the position of contact of the base 12 with the cardholder 26 is practically determined by the opposite end portions 42a of the protrusions 42. The vibration or shock generated in the card slot 20 is transmitted to the base 12 through the opposite end portions 42a of the protrusions 42. Since the opposite end portions 42a of the protrusions 42 are located individually near the positions corresponding to the nodes B of the bending vibration mode of the base 12, the base bending vibration mode can be prevented from being excited by any external shock and vibration. Accordingly, the magnetic disk 17, magnetic heads 19, etc., on the base 12 can be protected from undergoing vibration that is detrimental to the reading and writing of information. Thus, the HDD can be protected against erroneous operation and damage, so that its reliability can be improved. According to the fourth embodiment, moreover, the number of protrusions 42 can be reduced to facilitate working, and differences in height between the protrusions can be eliminated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

Although the protrusions are located on both the top and bottom sides of each side edge portion of the base or the cover according to the foregoing embodiments, for example, they may alternatively be provided on only one side, top or bottom, depending on restrictions on design. Further, the present invention is not limited to HDDs and is also applicable to any other card-shaped electronic apparatuses such as optical disk drives, modems, etc.

What is claimed is:

1. A card-shaped electronic apparatus capable of being inserted into a card slot having a pair of guide rails opposed substantially in parallel to each other, comprising:
   a base in the form of a substantially rectangular plate on which components are mounted and having a natural bending vibration mode; and
   a cover attached to the base and spreading over the components,
   the base having a pair of side edge portions configured to be guided along the guide rails, and a plurality of protrusions configured to determine the positions where the base contacts the guide rails through or not through the cover, the protrusions being located individually near positions corresponding to nodes of the bending vibration mode on each side edge portion and projecting in the thickness direction of the base.

2. An electronic apparatus according to claim 1, wherein the protrusions project individually from opposite surface sides of the base near the positions corresponding to the nodes.

3. An electronic apparatus according to claim 1, wherein the cover spreads over the side edge portions of the base and has side edge portions capable of being guided along the guide rails.

4. An electronic apparatus according to claim 1, wherein the protrusions extends along one of the side edge portions of the base and each protrusion has opposite end portions located near the positions corresponding to the nodes.

5. An electronic apparatus according to claim 1, wherein the components includes a disk, a drive motor for supporting and rotating the disk, a head for recording information on and reproducing it from the disk, and a head actuator supporting the head.

6. A card-shaped electronic apparatus capable of being inserted into a card slot having a pair of guide rails opposed substantially in parallel to each other, comprising:

a base in the form of a substantially rectangular plate on which components are mounted and having side edge portions and a natural bending vibration mode; and a cover spreading over the base, the cover having a pair of side edge portions in contact with the side edge portions of the base, individually, and configured to be guided along the guide rails, and a plurality of protrusions configured to determine the positions where the base contacts the guide rails through the cover, the protrusions being located individually near positions corresponding to nodes of the bending vibration mode on each side edge portion of the cover and projecting in the thickness direction of the base.

7. An electronic apparatus according to claim 6, wherein the protrusions project individually from opposite surface sides of the base in the positions corresponding to the nodes.

8. An electronic apparatus according to claim 6, wherein the protrusions extend along the side edge portions of the base and each protrusion has opposite end portions located near the positions corresponding to the nodes.

9. An electronic apparatus according to claim 6, wherein the component includes a disk, a drive motor for supporting and rotating the disk, a head for recording in and reproducing information from the disk, and a head actuator supporting the head.

10. A card-shaped electronic apparatus capable of being loaded into a card storage portion, comprising:

a base in the form of a substantially rectangular plate on which components are mounted and having a natural bending vibration mode; and a cover attached to the base and spreading over the component, the base having a side edge portion configured to engage the card storage portion, and a protrusion configured to determine the position where the base contacts the card storage portion through or not through the cover, the protrusion being located near a position corresponding to a node of the bending vibration mode on the side edge portion and projecting in the thickness direction of the base.

* * * * *